(12) United States Patent
Povazanec et al.

(10) Patent No.: US 9,843,437 B2
(45) Date of Patent: Dec. 12, 2017

(54) PROBABILISTIC DIGITAL DELAY MEASUREMENT DEVICE

(71) Applicant: Lantiq Beteiligungs-GmbH & Co. KG, Neubiberg (DE)

(72) Inventors: Juraj Povazanec, Singapore (SG); Biju Sukumaran, Singapore (SG); Mario Traeber, Singapore (SG)

(73) Assignee: Lantiq Beteiligungs-GmbH & Co. KG, Neubiberg (DE)

( * ) Notice: Subject to any disclaimer, the term of this patent is extended or adjusted under 35 U.S.C. 154(b) by 0 days.

(21) Appl. No.: 14/728,034

(22) Filed: Jun. 2, 2015

(65) Prior Publication Data

US 2016/0020896 A1    Jan. 21, 2016

(30) Foreign Application Priority Data

Jun. 4, 2014    (SG) .......................... 10201402890U (51) Int. Cl.
*H04L 7/00*    (2006.01)
*H04L 7/033*    (2006.01)

(52) U.S. Cl.
CPC .......... *H04L 7/0041* (2013.01); *H04L 7/0087* (2013.01); *H04L 7/0331* (2013.01)

(58) Field of Classification Search
CPC .......... G01R 31/3016; G01R 31/31709; G01R 31/3177; G04F 10/00; G04F 10/06; G04F 10/04; H03L 7/18; H04L 1/205
See application file for complete search history.

(56) References Cited

U.S. PATENT DOCUMENTS

| | | | |
|---|---|---|---|
| 6,754,613 | B2 | 6/2004 | Tabatabaei et al. |
| 7,339,984 | B1 | 3/2008 | Daou |
| 7,453,255 | B2 | 11/2008 | Sunter et al. |
| 8,489,947 | B2 | 7/2013 | Sunter |

(Continued)

FOREIGN PATENT DOCUMENTS

| | | |
|---|---|---|
| CN | 102025350 A | 4/2011 |
| EP | 0 575 058 A1 | 12/1993 |

(Continued)

OTHER PUBLICATIONS

J. Y. Lee, M. J. Park, B. H. Min, S. Kim, M. Y. Park and H. K. Yu, "A 4-GHz All Digital PLL With Low-Power TDC and Phase-Error Compensation," in IEEE Transactions on Circuits and Systems I: Regular Papers, vol. 59, No. 8, pp. 1706-1719, Aug. 2012.

(Continued)

*Primary Examiner* — David S Huang
(74) *Attorney, Agent, or Firm* — Eschweiler & Potashnik, LLC (57) ABSTRACT

A method and a corresponding device for providing a delay value of a communication electronic unit. A digital input signal is delayed by a delay element. The input and the output signals of the delay element are sampled and the sampled signals are compared. A mismatch counter is incremented when the amplitudes of the sampled signals are not equal and a signal transition counter N is incremented when the input signal transitions. The provided delay value is proportional to the mismatch counting value, proportional to the length of the sampling intervals and inversely proportional to the signal transition counting value.

20 Claims, 2 Drawing Sheets

(56) References Cited

U.S. PATENT DOCUMENTS

2006/0224347 A1* 10/2006 Tanikawa ......... G01R 31/31708
                                                              702/119
2011/0169501 A1    7/2011 Sato
2011/0298501 A1   12/2011 Mosalikanti et al.

FOREIGN PATENT DOCUMENTS

| JP | 07242064 A   | 9/1995  |
|----|--------------|---------|
| JP | 2005117585 A | 4/2005  |
| JP | 2005326918 A | 11/2005 |
| JP | 2008157881 A | 7/2008  |

OTHER PUBLICATIONS

S. Sunter and A. Roy, "A selt-testing BOST for high-frequency PLLs, DLLs, and SerDes," 2007 IEEE International Test Conference, Santa Clara, CA, 2007, pp. 1-8.

N. Chaudhuri, S. Ghosh and A. M. Ghosh, "A Technique for Simultaneous Measurement with a Microcomputer," in IEEE Transactions on Industrial Electronics, vol. IE-32, No. 2, pp. 114-119, May 1985.

C. Y. Kuo and J. L. Huang, "A period tracking based on-chip sinusoidal jitter extraction technique," 24th IEEE VLSI Test Symposium, Berkeley, CA, 2006, pp. 6-405.

A. H. Chan and G. W. Roberts, "A synthesizable, fast and high-resolution timing measurement device using a component-invariant vernier delay line," Test Conference, 2001. Proceedings. International, Baltimore, MD, 2001, pp. 858-867.

W. Koodziejski, S. Kuta and J. Jasieski, "Current controlled delay line elements' improvement study," Signals and Electronic Systems (ICSES), 2012 International Conference on, Wroclaw, 2012, pp. 1-4.

* cited by examiner

PROBABILISTIC DIGITAL DELAY MEASUREMENT DEVICE

The present specification relates to a digital delay measurement device, a method for measuring a delay of a digital signal and to devices including the digital delay measurement device, such as a constant delay element.

In communication electronic devices, it is often desired to delay a signal by a fixed amount of time, for example in a GPS system or in the transmission of video and audio data. However, it may be difficult or expensive to build an element that keeps this delay sufficiently constant over time as production-related influences, such as changes due to lithographical variation during IC manufacturing and other significant chemical variation, and operating conditions, such as variations of temperature and voltage, affect the delay of delay element.

Further applications of a constant delay element include the control of a computer clock rate. Present day computer chips often use high clock rates. At high clock rates, production variations and operating conditions that influence the delay rate may affect the synchronisation of the electronic components.

One specific example of digital circuit using a delay chain to delay a signal by a pre-determined amount of time is a delay locked loop (DLL). A DLL can be used to change the phase of a clock signal, usually to enhance the clock rise-to-data output valid timing characteristics of integrated circuits. DLLs can also be used for clock recovery (CDR).

The main component of a DLL is a delay chain composed of many delay gates connected front-to-back. The input of the delay chain is connected to the clock that is to be negatively delayed. A multiplexer is connected to each stage of the delay chain and the selector of this multiplexer is automatically updated by a control circuit to produce the negative delay effect. The output of the DLL is the resulting, negatively delayed clock signal.

The present specification discloses an improved feedback mechanism for compensating delay variations by measuring an actual delay and by adjusting the delay over time according to the measured delay. In particular, the feedback mechanism according to the present specification comprises a low frequency sampling, wherein an output signal and/or an input signal are sampled at a sampling period that may be large compared to an accuracy of a delay to be measured.

According to the present specification, a low sampling period may be used, among others to provide a low cost device with sufficient accuracy or to further enhance the accuracy of a delay measurement. In particular, for multimedia applications such as the transmission and display of video data a low cost device may provide a sufficient delay accuracy.

In particular, the signals to be compared, such as the input signal and the output signal of a delay chain, are provided by two digital signals having the same amplitude and having essentially the same rectangular shape or being composed of essentially the same rectangular pulses. The two signals follow the same input signal clock. Furthermore, the expected delay is always smaller than one clock period of the input signal clock and the delay does not change abruptly or by a large amount over time. Furthermore, the two samplings are not themselves subject to sampling delay or at least those delays are negligible and it is allowable to provide an estimation of the delay based on a large number of samples.

The delay chain may be realized, by way of example, with a tapped delay line that contains a number of cells with well-defined delay times. This may be realized for example with D-flip-flop cells with pre-determined delay times, which are connected in series.

Preferably, the sampling period is shorter than a clock period of the input signal or the minimum distance between two transitions of the input signal. In a further embodiment, the sampling period is at least slightly shorter than an expected delay. On the other hand, the sampling period may be much longer than an accuracy of the delay measurement to be achieved.

The present specification discloses a computer implemented method for providing or generating a delay value of a communication electronic unit with a delay chain.

A digital input signal and its corresponding delayed output signal of the communication electronic unit are sampled at a sampling interval of a pre-determined length, especially with a long sampling period that is comparable to or at least not much shorter than an expected delay.

An amplitude or a voltage level of the sampled input signal is compared with an amplitude of the sampled output signal and a mismatch counting value M is incremented each time when the amplitude of the sampled input signal is not equal to the amplitude of the sampled output signal within a pre-determined tolerance.

A signal transition counting value N is incremented each time the input signal transitions, wherein a transition of the input signal may also be derived from a transition of the output signal.

The signal delay value between the input signal and the output signal is generated as a value that is also referred to as probabilistic value. The generated signal delay value is directly proportional to the mismatch counting value M, directly proportional to the length of the sampling intervals and inversely proportional to the signal transition counting value N.

In one embodiment, the sampling is performed simultaneously as the sampling of an input signal and an output signal of a delay chain.

In particular, the sampling may be performed by one or more one-bit samplers for sampling a signal with two voltage levels.

In one embodiment, the sampling is triggered regularly using a reference clock, wherein a sampling period of the reference clock is different from a clock period of the digital input signal. Thereby, the pulses of the reference clock shift relative to the clock pulses of the digital input signal and the alignment of the reference clock pulses is made independent of the alignment of the clock pulses of the digital input signal.

In particular, in one embodiment, a period of the reference clock is chose such that a multiple of a sampling period of the reference clock that is closest to one clock period of the input signal is offset against a clock period of the input signal by no more than 10% of the clock period of the input signal. Thereby, the reference clock pulses are only shifted by a small amount each time with respect to the input clock pulses. This can provide a finer time resolution.

According to one embodiment, the transitions of the input signal are detected at the input signal, in particular by detecting transitions of the input signal at an input of a delay chain. Thereby, the detection of input signal transitions is synchronized with a detection of the input signal value.

According to another embodiment, the transitions of the input signal are detected at the output signal, in particular by detecting transitions of the input signal at an output of the adjustable delay element. The relationship between the input and output signal is such that a transition is followed by an inversion of the levels or values of the input signal and the output signal.

In one embodiment, the probabilistic delay value is determined from a time period that is equal to a time between the input signal transition and an inversion of input and output values.

In particular, the probabilistic delay value D can calculated according to the equation D=T_ref*M/N, wherein the quotient is computed with a pre-determined accuracy and wherein T_ref is a sampling period between two consecutive sampling times, M is the mismatch counting value and N is the transition counting value.

According to the present specification various criteria maybe applied to determine when a sufficient accuracy has been reached. According to a one embodiment, an integration interval after which the delay value is calculated depends on a pre-determined number of input signal transitions. According to another embodiment, an integration interval after which the delay value is calculated depends on a pre-determined number of mismatches. According to yet another embodiment, an integration interval is bounded by a pre-determined integration time. These criteria may also be combined.

According to a further embodiment, the probabilistic delay value is calculated based on the signal mismatches and transitions that occur within a sliding time window. By way of example, a sliding time windows may be realized with a shift register or the like, by reading in new values at the beginning and discarding old values at the end of a queue.

According to a further embodiment, the method comprises adjusting of a delay according to the probabilistic delay value by deactivating or activating components of a delay chain. Therein, the number of components to be activated or deactivated depends on the delay. In particular, the number may be proportional to the delay.

Furthermore, the present specification discloses a delay generator for providing a pre-determined delay of a digital input signal The delay generator comprises an adjustable delay element, such as a delay chain. The adjustable delay element comprises with a signal input for receiving an input signal and a signal output for outputting a delayed output signal.

A reference clock is provided for synchronizing a sampling of the input signal and the output signal. A signal comparing unit, for example in the form of two one-bit samplers and an XOR gate or other electronic components for comparing two digital input signals, is provided for comparing the input signal with the output signal at pre-determined sampling times and for counting a number of mismatches between the input signal and the output signal. The pre-determined sampling times of the signal comparing unit are provided by the reference clock.

A transition detecting unit, for example in the form of an edge detector for a digital signal such as a flip-flop or other electronic component, is provided in a signal path of the input signal. The transition detecting unit is operative to detect signal transitions and to count a number of the signal transitions.

A delay estimation unit is connected to the signal comparing unit and to the transition detection unit. The delay estimation unit is provided for receiving a number of mismatches from the signal comparing unit, for receiving a number of signal transitions from the transition detecting unit and for computing an estimated delay. By way of example the delay estimation unit can be provided by a computation unit such as an arithmetic logic unit (ALU) comprising electronic components such as adders and memory registers.

The estimated delay of the delay estimation unit, which is also referred to as probabilistic delay value or delay value, is proportional to the number of mismatches and inversely proportional to the number of transitions.

The delay generator further comprises a controller that is connected to the delay estimation unit and to the adjustable delay element. In particular, the delay estimation unit may comprise the controller. The delay generator provides a control signal to the adjustable delay element, the control signal depending on the estimated delay.

In one particular embodiment, the controller of the adjustable delay element is operative to adjust the delay by activating and by deactivating individual electronic components of the adjustable delay element. In particular, activating and deactivating may refer to switching the electronic components on and off.

According to one embodiment the signal comparing unit comprises a first one-bit sampler and a second one-bit sampler. In particular, the first one-bit sampler and the second one-bit sampler may be realized by one-bit samplers that comprise a flip-flop element.

In one particular embodiment, the signal comparing unit comprises an XOR gate for comparing a first signal that represents a first bit with a second signal that represents a second bit.

Moreover, the present specification discloses an integrated circuit with the abovementioned delay generator, wherein the delay generator is realized by semiconductor components of the integrated circuit.

Furthermore, the present specification discloses a communication electronic system with the integrated circuit.

A delay compensation device according to the present specification does not require two matching variable delay chains. Thereby, power consumption can be reduced, as the power consumption of a delay chain is defined by the frequency of the input and each delay chain consumes power. Moreover, the delay compensation according to the present specification is not limited to a linear response of a delay cell to a control signal and can be used to account for nonlinearities.

In summary, a delay compensation device according to the present specification can be designed to require less area on the chip and to consume less power than a delay compensation device with two delay chains and it can be designed to accommodate nonlinearities of chain. Furthermore, by using a design with only one delay chain there is no mismatch delay between two delay chains.

In particular, according to the present specification a delay may be measured in increments that are much smaller than is feasible by using a direct measurement with an available reference clock. This is achieved by measuring the delay using a statistical accumulation of transitional events.

According to the present specification, both the input signal and the delayed output signal are sampled at regular intervals. Every time a state is detected such that the input is not equal to the output, a mismatch counter M is incremented. Furthermore, a separate counter N counts the input signal transitions. An estimated delay between the input and output is computed that is directly proportional to the counting value of the mismatch number M and inversely proportional to the number N of input signal transitions.

The subject of the present specification is now explained in further detail with respect to the following Figures, wherein.

In the following description, details are provided to describe the embodiments of the present specification. It shall be apparent to one skilled in the art, however, that the embodiments may be practised without such details.

Figure 1:
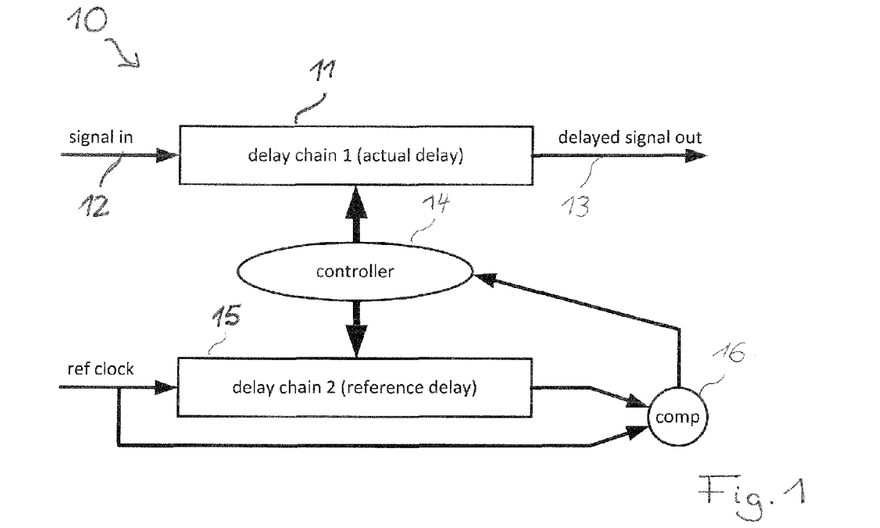
FIG. 1 shows a delay device for generating a pre-determined delay using a feed forward control according to a first embodiment.

FIG. 1 shows a first embodiment of a delay device 10 for generating a controlled delay. The delay device according to FIG. 1 uses a feed forward control to generate a control signal for adjusting a delay circuit of the delay device.

The delay device comprises a delay chain unit 11 with a delay chain circuit. The delay chain unit 11 is connected to an input line and an output line. A controller 14 is electrically connected to an adjustable element of the delay chain unit 11.

Furthermore, the delay device comprises a reference clock which is connected to an input of a reference delay chain unit 15 with a reference delay chain circuit. In particular, the reference delay chain unit 15 may comprise similar or identical components to the delay chain unit 11. An input of a comparator 16 is connected to an output of the reference clock and to an output of the reference delay chain unit 15. An output of the comparator 16 is connected to an input of the controller 14.

In particular, the comparator 16 may be operative to calculate a delay between a clock signal of the reference clock and an output signal of the reference delay chain unit 15. During operation, the controller 14 adjusts the delay chain circuit of the delay chain unit 11 and/or the reference delay chain circuit of the reference delay chain unit 15 according to an output signal of the comparator 16.

In one embodiment, the two delay chains 11, 15 are of identical design. In that way, a delay measured on the reference chain 15 can be applied to the actual signal delaying chain 11. According to one embodiment, the reference chain 15 is used to match a pre-determined delay, for example 1 ns, and a read out is done of to find the number of delay stages required to match the pre-determined delay. Assuming that the chain delay is proportional to the control value, the control value for the first delay chain 11 can be derived, knowing the control value of the reference chain 15.

If a direct measurement of the delay is used, such as in the embodiment of FIG. 1, a delay of 100 ns can be measured within an accuracy of +/−1 ns with a 1 GHz clock by counting the number of 1 GHz clock pulses, 100 in this example, that it takes for the signal to propagate from input to output. However, it is not possible to measure a 500 ps delay within an accuracy of +/−10 ps in this way using a 1 GHz clock, as events happen 100 times more frequently than the clock pulses of the 1 GHz clock.

Figure 2:
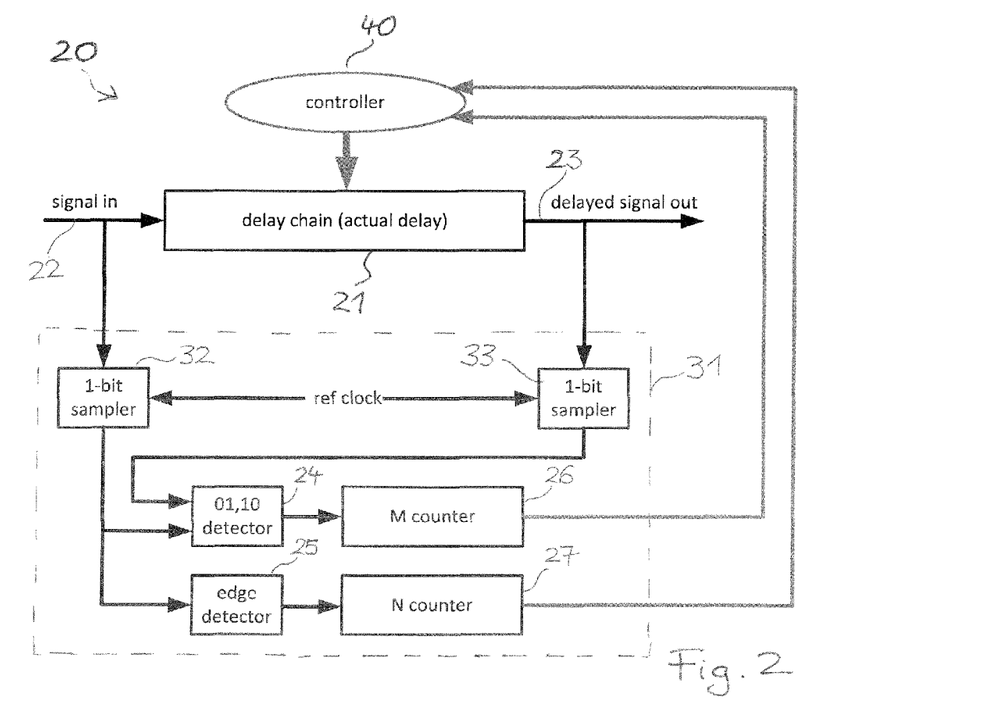
FIG. 2 shows a delay device for generating a pre-determined delay using a feedback control and under-sampling according to a second embodiment.

FIG. 2 shows a delay device 20 for generating a controlled delay according to a second embodiment.

The delay device 20 comprises an adjustable delay chain 21 and a delay measurement device 31. Among others, the delay measurement device comprises a mismatch detector or "01,10 detector" 24, an edge detector 25, a mismatch counter 26, a transition counter 27, a first single bit sampler 32 and a second single bit sampler 33.

The adjustable delay chain 11, 21 is a digital or an analog delay chain, for which a delay can be incremented or decremented via control input. The single bit samplers 32, 33 are synchronizing, single bit elements that are able to sample an input value of 0 or 1 and to provide it synchronously for further processing. The samplers 32, 33 both use the reference clock 42.

Figure 4:
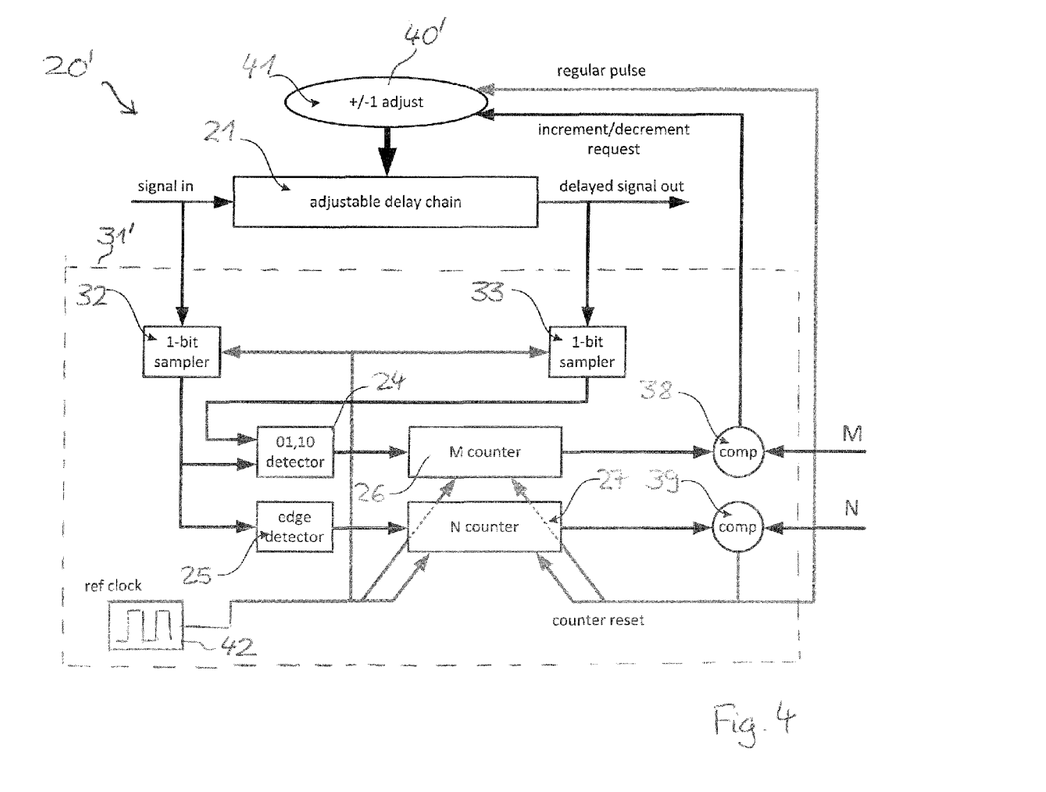
FIG. 4 shows a delay device according to a third embodiment that is similar to the embodiment of FIG. 2.

The mismatch detector 24 comprises a dual-input XOR gate that is able to indicate when the two inputs have different values, which can be "01" or "10" in the embodiments of FIGS. 2 and 4. Then, the XOR gate outputs 1=0 XOR 1=1 XOR 0. If the two inputs are the same, the XOR gate outputs 0=0 XOR 0=1 XOR 1.

The edge detector 25 indicates when the input signal has transitioned from a low to a high level or from a high to a low level. The indication lasts a single reference clock cycle of a reference clock, which is not shown in FIG. 2.

The mismatch counter 26 counts the number of mismatches detected by the mismatch detector 24. The mismatch counter 26 comprises a reset input for resetting the counting value M of the mismatch counter 26 to zero. The transition counter 25, or edge detector counts the number of input signal transitions. The transition counter comprises a reset input for resetting the counting value N of the transition counter to zero. According to one embodiment, the counting values of the counters 26, 27 are reset to zero when the number of transitions reaches a pre-determined value of N. This may be determined by an N-comparator, which is not shown in FIG. 2.

The first single-bit sampler 32 is connected to a signal input 22 of the delay chain 21 and the second single-bit sampler 32 is connected to a delayed signal output 23 of the delay chain 21.

An output of the first single-bit sampler 32 is connected to an input of the mismatch detector 24 and to an input of the edge detector 25. An output of the second single-bit sampler 33 is connected to an input of the edge detector 25.

An input of the mismatch counter 26 is connected to an output of the mismatch detector 24 and an input of the transition counter 27 is connected to an input of the edge detector 25.

An output of the 26 is connected to a first input of a controller 40 and an output of the 27 is connected to a second of input of the controller 40. An output of the controller 40 is connected to an input of the delay chain 21. The delay chain 21 is operative to adjust the delay in response to a signal from the controller 40, for example by chaining a number of delay elements or by adjusting a bias voltage of a transistor.

In one embodiment, the controller 40 comprises a first comparator 38 for the mismatch count M, a second comparator 39 for the transition count N and an adjustment module 41 which is connected to an output of the first comparator and an output of the second comparator. According to another embodiment, the first and second comparators 38, 39 are part of the delay measurement device 31. The comparators 38, 39 and the adjustment module 41 are shown in the embodiment of FIG. 4.

In the following, it is assumed that the input signal is a digital signal with a high level, referred to as "1" and a low level, referred to as "0". A transition from the high-level to the low level is referred to as "10" transition and a transition from the low level to the high level is referred to as "01" transition. However, this does not limit the subject of the present specification to a specific data encoding method. Among others, the transitions of the input signal may be used in different ways to encode a binary data stream or they may be used to represent a digital clock pulse.

In a more general embodiment, a delay measurement device 31, 31' according to the present specification may also be used to determine a delay for a digital signal with multiple levels, for example a digital audio signal before a digital/analog conversion.

During operation, the input signal and the output signal of the delay chain are simultaneously sampled by the two single-bit samplers. In one embodiment, the sampling is regular, using a reference clock that is independent of the input signal. An independent reference clock provides bit-samples with a good statistic that is independent from the input signal. In particular, it is advantageous if a period of the reference clock, or a multiple of the reference clock period, is slightly different from a multiple of a clock period of the input signal. From a sufficient number of samples, the approximate delay value can be derived.

By way of example, if a sampling period, or a multiple of the sampling period, is slightly longer than a multiple of the input signal clock period, the locations of the sampling points behind successive signal transitions are slightly shifted with respect to each other. Thereby, an effective density of the sampling points can be increased. For example, in the example of FIG. 3 five sampling periods are slightly longer than a minimum time between consecutive transitions of the input signal.

The edge detector 25 detects transitions of the input signal. Every time a transition happens, it is followed by an inverse in input/output values when the input signal is not equal to the output signal due to the delay. This can be best seen in FIG. 3. This transitional state exists for a time period equal to the delay of the delay chain. Herein, it is assumed that the time delay is shorter than a minimum distance between two transitions of the input signal. This assumption is fulfilled for many applications.

By sampling in regular intervals, the transitional state can be hit or missed. The probability of hit and miss is directly related to the value of delay. Hence, the delay value generated by this proposal may be considered as a probabilistic delay value. Herein, it is assumed that the delay does not change or changes only very little during an evaluation time window during which the delay is determined. This is especially the case for a delay that is caused by slowly varying conditions such as the temperature or the chemical composition of the semiconductor material. The evaluation time window is also referred to as integration time.

Whenever a hit, or in, other words, a mismatch between the input signal and the delayed output signal, is detected, the mismatch counter M is incremented. A second counter, N, counts the number of input signal transitions and is incremented whenever an input signal transition is detected.

According to the present specification, a total delay after N signal transitions is approximated by the mismatch counter M times the sampling period T_ref. Accordingly, the delay D after one signal transition is approximated by dividing the number M of mismatches between the input signal and the delayed output signal times the sampling period T_ref by the number N of signal transitions, which yields the formula $$D = T_{ref} * \frac{M}{N}$$

Furthermore, an estimate of a relative delay may be derived from the delay value D, for example by dividing the estimate D of the delay by a clock time of the input signal or by the sampling period.

When the delay does not change during an integration time or when the delay change is negligible, the transitional state after a signal transition becomes a repetitive process even though the input signal itself may not be repetitive or even have a pre-determined sequence of transitions. According to the present specification, this effect is used to sample a plurality of transitional states at different sampling times after the corresponding signal transitions instead of sampling with a smaller sampling period after a given signal transition.

The estimate D of the delay improves for a longer sampling window. Furthermore, it is advantageous if the sampling frequency, or a multiple thereof, is not a multiple of an input signal clock frequency but slightly different from a multiple of the input signal clock frequency. In particular, an estimate D of the actual delay t_D may be considered as sufficiently accurate for a predetermined minimum number of sampling pulses and/or for a predetermined minimum number N_min of input signal transitions.

By using a count of signal transitions of the input signal according to the present specification it is not necessary to use a periodic test signal or even a test signal with a pre-determined pattern of transitions in order to determine the delay between the input signal and the delayed output signal, although such signals may be used if desired. The input signal only needs to have a sufficient number of transitions within an integration time. Thereby, the signal delay can be determined while information is transmitted over an input signal line.

Signals with only a few transitions, which are less suitable for a delay determination, may be pre-processed. For example, a raw signal encoding a black and white line image usually has long sequences of the same bit. These sequences can be made shorter by using a compression such as run length encoding. Furthermore, the distribution of 1s and 0s can be made more even with a signal scrambler. The pre-processing or encoding can be reversed on a decoding side by using a decompression unit and a descrambling unit.

The integration time does not need to be fixed in advance but the mismatch count M can be incremented until a pre-determined number of transitions N of the input signal or a pre-determined number of mismatches M is reached.

Figure 3:
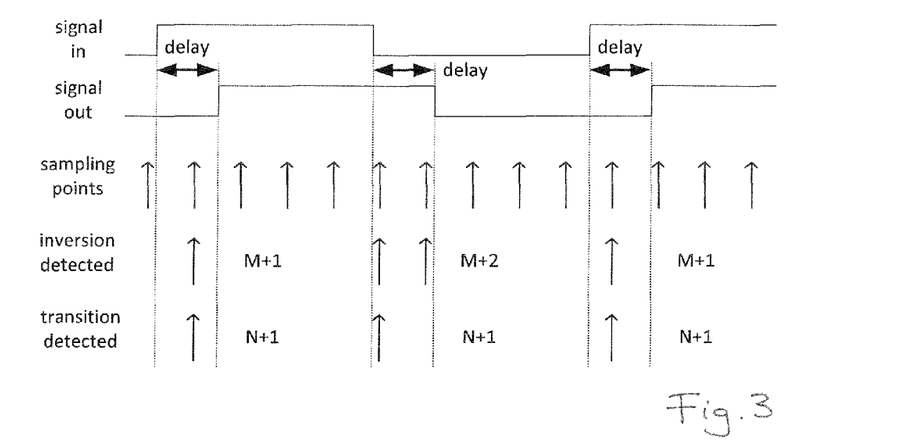
FIG. 3 illustrates a delay estimation computation of a delay estimation unit of FIG. 1.

FIG. 3 shows an example of calculating an estimate of the time delay between an input signal. In the example of FIG. 3, a sampling window comprises 14 sampling periods.

At the second sampling time, the input signal "signal in" has a level "1" and the delayed output signal "signal out" has a level "0", yielding a difference signal with level "1". At the third sampling time, no mismatch between the input signal and the output signal is detected. Hence, the mismatch counter M is increased by one. Furthermore, a transition of the input signal is detected between the first and the second sampling time. Hence, the transition counter N is increased by one.

At the sixth and seventh sampling time, a mismatch between input and output signal is detected but not at the eight sampling time. Hence, the mismatch counter M is increased by two. Furthermore, a transition of the input signal is determined at the sixth sampling time and the transition counter N is increased by one.

At the eleventh sampling time, a mismatch between input and output signal is detected but not at the twelfth sampling time. Hence, the mismatch counter M is increased by one.

Furthermore, a transition of the input signal is determined at the eleventh sampling time and the transition counter N is increased by one.

This gives an estimated or measured delay D of $$D = T_{ref} * \frac{4}{3}.$$

Visual comparison of the signals in FIG. 4 shows that the delay is slightly larger than one sampling period, which is consistent with the above estimate. Accumulating a larger number of samples, while having a signal frequency unrelated sampling, would increase the precision of the measured delay value D.

FIG. 4 shows a further embodiment of a delay device 20' with a delay measurement device 31' and a controller 40'. For brevity, components which were explained above with respect to FIG. 2 are not explained again.

The delay measurement device 31' comprises a mismatch comparator 38, which is connected to an output of the mismatch counter 26 and to a source of an expected number M_exp of mismatches. For example, the mismatch comparator 38 may be connected to a computation unit that is operative to read out the expected number of mismatches M_exp from a computer readable memory. The mismatch comparator 38 compares the number of mismatches accumulated over a number N_max of transitions and compares it to M_exp, the number of expected mismatches.

Furthermore, the delay measurement device 31' comprises a transition comparator 39, which is connected to an output of the transition counter 27 and to a source of a required number of transitions N_max. For example, the mismatch comparator 38 may be connected to a computation unit that is operative to read out the required number of transitions N_max from a computer readable memory. The transition comparator 39 keeps track of the number of transitions. When a required number N_max of transitions is reached, both counters are reset.

The controller 40' comprises an adjustment module 41, which is connected to an output of the mismatch comparator 38 and to an output of the transition comparator 39. The output of the transition comparator 39 is used as a regular pulse to trigger an action of the adjustment module 41.

At every tick received from the transition comparator 39, the adjustment module 41 checks the output of the mismatch comparator 38 and decides to increment, decrement or maintain a control value or control parameter of the adjustable delay chain 21. Thereby, the delay of the delay chain 21 is kept within a required narrow range.

FIG. 4 illustrates two means for resetting the counters 26, 27 which may be used alone or in combination. According to a first reset condition, the counters are reset when a predetermined number N_max of transitions has been reached. According to a second reset condition, the counters are reset when a predetermined maximum number of clock pulses of the reference clock 42 has been reached. The conditions may be used in combination, for example by using the condition which is reached first or which is reached last as a trigger for a reset.

The embodiments can also be described with the following lists of elements being organized into items. The respective combinations of features which are disclosed in the item list are regarded as independent subject matter, respectively, that can also be combined with other features of the application.

1. A method for providing, or generating, a pre-determined delay value of an output signal from a delay chain of a communication electronic unit, the method comprising:
   providing pre-determined sampling intervals with a reference clock, the pre-determined sampling intervals being different from a clock period of the digital input signal,
   sampling a digital input signal of the delay chain with a one-bit sampler at the pre-determined sampling intervals,
   sampling the digital output signal of the delay chain at the pre-determined sampling intervals,
   comparing an amplitude, such as a voltage level, of the sampled input signal with an amplitude of the sampled output signal,
   incrementing a mismatch counter M each time when the amplitude of the sampled input signal is not equal to the amplitude of the sampled output signal within a pre-determined tolerance,
   detecting signal transitions of the input signal with a transition detector, the transition detector being provided in a signal pathway of the input signal,
   incrementing a signal transition counter N each time an input signal transition is detected, and, after an integration time,
   generating the signal delay value between the input signal and the output signal as a quotient of the mismatch counting value M and the transition counter N, multiplied by the length of the sampling intervals.

Herein, the input signal transition may be detected at the input or at the output of the adjustable delay element. The length of the sampling intervals is also referred to as sampling period.

2. A delay generator for providing a pre-determined delay of a digital signal input signal, in particular an input signal having two levels or amplitudes, the delay generator comprising
   an adjustable delay chain with a signal input and a signal output,
   a reference clock for providing a sampling period,
   a first one-bit sampler, the first one-bit sampler being connected to the signal input of the adjustable delay chain and to an output of the reference clock,
   a second one-bit sampler, the second one-bit sampler being connected to the signal output of the adjustable delay chain and to an output of the reference clock,
   a transition detecting unit, the transition detecting unit being connected to the signal input of the adjustable delay chain or to the signal output of the adjustable delay chain,
   a signal mismatch detecting unit with a first input, a second input and an output, the first input of the signal mismatch detecting unit being connected to an output of the first one-bit sampler and the second input of the signal mismatch detector being connected to an output of the second one-bit sampler,
   a signal mismatch counting unit, the signal mismatch counting unit being connected to the output of the signal mismatch detecting unit,
   a transition counting unit, the transition counting unit being connected to an output of the transition detecting unit,
   a delay controller, the delay controller being operatively connected to a control input of the adjustable delay chain, the delay controller being operative to control a delay of the adjustable delay chain and the delay controller being connected to an output of the mismatch counting unit and to an output of the transition counting unit.

Although the above description contains much specificity, these should not be construed as limiting the scope of the embodiments but merely providing illustration of the foreseeable embodiments. Various modifications are possible within the scope of the present specification. For example, the reference clock may be part of the delay measurement device or external to it, the comparators may be part of the delay measurement device, they may be part of the controller or they may be external to both components. The components shown in FIG. 2 and FIG. 4 may be located on one integrated circuit or on several integrated circuits or they may comprise components on a printed circuit board, among others.

Furthermore, the delay may be estimated using non-overlapping integration intervals or the delay may also be estimated using a sliding time window. For example, for an updated estimate of the delay the mismatches after the transitions before the current position of the sliding time window are disregarded and the mismatches after the transitions that are within the new position of the sliding time window are counted.

In particular, the above stated advantages of the embodiments should not be construed as limiting the scope of the embodiments but merely to explain possible achievements if the described embodiments are put into practise. Thus, the scope of the embodiments should be determined by the claims and their equivalents, rather than by the examples given.

REFERENCE NUMBERS 10 delay device
11 delay chain
12 signal input
13 signal output
14 controller
15 reference delay chain
16 comparator
20 delay device
21 delay chain
22 signal input
23 signal output
24 mismatch detector
25 transition/edge detector
26 mismatch counter
27 transition/edge counter
31, 31' delay measurement device/unit
32 one-bit sampler
33 one-bit sampler
38 comparator
39 comparator
40, 40' controller
41 adjustment module
42 reference clock

The invention claimed is:

1. A method for providing a delay value of a communication electronic unit, the method comprising:
sampling a digital input signal and its corresponding delayed output signal of the communication electronic unit at a sampling interval of a pre-determined length,
comparing an amplitude of the sampled input signal with an amplitude of the sampled output signal,
incrementing a mismatch counting value M each time when the amplitude of the sampled input signal is not equal to the amplitude of the sampled output signal,
incrementing a signal transition counting value N each time the input signal transitions, and
generating the signal delay value between the input signal and the output signal as a probabilistic delay value that is directly proportional to the mismatch counting value M, directly proportional to the length of the sampling intervals and inversely proportional to the signal transition counting value N.

2. The method of claim 1, wherein the step of sampling comprises simultaneously sampling an input and an output of a delay chain.

3. The method of claim 1, wherein the sampling is performed by one or more one-bit samplers.

4. The method of claim 1, wherein the sampling is triggered regularly using a reference clock, wherein a sampling period of the reference clock is different from a clock period of the digital input signal.

5. The method of claim 4, wherein a multiple of a sampling period of the reference clock that is closest to one clock period of the input signal is offset against a clock period of the input signal by no more than 10% of the clock period of the input signal.

6. The method of claim 1, wherein transitions of the input signal are derived from the input signal.

7. The method of claim 1, wherein transitions of the input signal are derived from the output signal.

8. The method of claim 1, wherein the probabilistic delay value is determined from a time period equal to a time between the transition and an inversion of input and output values.

9. The method of claim 1, wherein the probabilistic delay value D is calculated using the following equation: $D = T\_ref * M/N$, wherein $T\_ref$ is a sampling period between two consecutive sampling times, M is the mismatch counting value and N is the transition counting value.

10. The method of claim 1, wherein an integration interval after which the delay value is calculated depends on a pre-determined number of input signal transitions.

11. The method of claim 1, wherein an integration interval after which the delay value is calculated depends on a pre-determined number of mismatches.

12. The method of claim 1, wherein an integration interval does not exceed a pre-determined integration time.

13. The method of claim 1, wherein the probabilistic delay value is calculated based on the signal mismatches and transitions that occur within a sliding time window.

14. The method of claim 1, comprising adjusting of a delay according to the probabilistic delay value, the adjustment comprising deactivating or activating components of a delay chain, the number of components depending on the delay.

15. A delay generator for providing a pre-determined delay of a digital signal input signal, the delay generator comprising
an adjustable delay element with a signal input for receiving an input signal and a signal output for outputting a delayed output signal,
a reference clock,
a signal comparing circuit for comparing the input signal with the output signal at pre-determined sampling times and for counting a number of mismatches between the input signal and the output signal, the pre-determined sampling times of the signal comparing circuit being provided by the reference clock, a transition detecting circuit which is provided in a signal path of the input signal, the transition detecting circuit being operative to detect signal transitions and to count a number of the signal transitions, a delay estimation circuit for receiving the number of mismatches from the signal comparing circuit, for receiving the number of signal transitions from the transition detecting circuit and for computing an estimated delay that is proportional to the number of mismatches and inversely proportional to the number of transitions, a controller that is connected to the delay estimation circuit and to the adjustable delay element for providing a control signal to the adjustable delay element, the control signal depending on the estimated delay.

16. The delay generator according to claim 15, wherein the controller of the adjustable delay element is operative to adjust the delay by activating and by deactivating individual electronic components of the adjustable delay element.

17. The delay generator according to claim 15, wherein the signal comparing circuit comprises a first one-bit sampler and a second one-bit sampler.

18. The delay generator according to claim 15, wherein the signal comparing circuit comprises an XOR gate.

19. An integrated circuit with a delay generator, the delay generator comprising:

an adjustable delay element with a signal input for receiving an input signal and a signal output for outputting a delayed output signal, a reference clock, a signal comparing circuit for comparing the input signal with the output signal at pre-determined sampling times and for counting a number of mismatches between the input signal and the output signal, the pre-determined sampling times of the signal comparing circuit being provided by the reference clock, a transition detecting circuit which is provided in a signal path of the input signal, the transition detecting circuit being operative to detect signal transitions and to count a number of the signal transitions, a delay estimation circuit for receiving the number of mismatches from the signal comparing circuit, for receiving the number of signal transitions from the transition detecting circuit and for computing an estimated delay that is proportional to the number of mismatches and inversely proportional to the number of transitions, a controller that is connected to the delay estimation circuit and to the adjustable delay element for providing a control signal to the adjustable delay element, the control signal depending on the estimated delay, the delay generator comprising semiconductor components of the integrated circuit.

20. A communication electronic system, the communication electronic system comprising an integrated circuit with a delay generator, the delay generator comprising:

an adjustable delay element with a signal input for receiving an input signal and a signal output for outputting a delayed output signal, a reference clock, a signal comparing circuit for comparing the input signal with the output signal at pre-determined sampling times and for counting a number of mismatches between the input signal and the output signal, the pre-determined sampling times of the signal comparing circuit being provided by the reference clock, a transition detecting circuit which is provided in a signal path of the input signal, the transition detecting circuit being operative to detect signal transitions and to count a number of the signal transitions, a delay estimation circuit for receiving the number of mismatches from the signal comparing circuit, for receiving the number of signal transitions from the transition detecting circuit and for computing an estimated delay that is proportional to the number of mismatches and inversely proportional to the number of transitions, a controller that is connected to the delay estimation circuit and to the adjustable delay element for providing a control signal to the adjustable delay element, the control signal depending on the estimated delay, the delay generator comprising semiconductor components of the integrated circuit.

* * * * *